(12) United States Patent (10) Patent No.: US 9,231,066 B2
Kim et al. (45) Date of Patent: Jan. 5, 2016

(54) SEMICONDUCTOR DEVICE HAVING VERTICAL CHANNEL

(71) Applicant: SK HYNIX INC., Icheon (KR)

(72) Inventors: Seung Hwan Kim, Seoul (KR); Jai Hoon Sim, Seongnam (KR)

(73) Assignee: SK HYNIX INC., Icheon (KR)

( * ) Notice: Subject to any disclaimer, the term of this patent is extended or adjusted under 35 U.S.C. 154(b) by 98 days.

(21) Appl. No.: 14/205,228

(22) Filed: Mar. 11, 2014

(65) Prior Publication Data

US 2014/0353745 A1 Dec. 4, 2014

(30) Foreign Application Priority Data

May 31, 2013 (KR) ........................ 10-2013-0062907

(51) Int. Cl.
*H01L 29/78* (2006.01)
*H01L 29/417* (2006.01)
*H01L 27/108* (2006.01)
*H01L 29/66* (2006.01)

(52) U.S. Cl.
CPC .... *H01L 29/41741* (2013.01); *H01L 27/10814* (2013.01); *H01L 27/10823* (2013.01); *H01L 27/10876* (2013.01); *H01L 27/10885* (2013.01); *H01L 29/66666* (2013.01); *H01L 29/7827* (2013.01)

(58) Field of Classification Search
CPC ............... H01L 27/10876; H01L 27/10885; H01L 27/10814; H01L 27/1052; H01L 27/10823; H01L 27/10844; H01L 29/7827; H01L 29/66666; H01L 29/41741
USPC ........................... 257/330, 331, 328, E21.41
See application file for complete search history.

(56) References Cited

U.S. PATENT DOCUMENTS

| 2012/0168854 A1 | 7/2012 | Jang et al. | |
| 2012/0299088 A1* | 11/2012 | Heineck et al. | 257/329 |
| 2013/0043525 A1* | 2/2013 | Yu et al. | 257/329 |
| 2013/0187220 A1* | 7/2013 | Surthi | 257/329 |
| 2013/0240965 A1* | 9/2013 | Park et al. | 257/296 |
| 2013/0248989 A1* | 9/2013 | Lee et al. | 257/330 |

FOREIGN PATENT DOCUMENTS

| KR | 10-1030974 B1 | 5/2011 |
| KR | 10-2012-0078917 A | 7/2012 |

\* cited by examiner

*Primary Examiner* — Michael Trinh

(57) ABSTRACT

A vertical-channel semiconductor device includes an active pillar including a channel region, a gate located at a sidewall of the active pillar, a buried bit-line formed below the active pillar, and an insulation film formed below the buried bit-line. Some parts of the buried bit-line are replaced with an insulation film, such that a bit-line junction leakage is prevented.

14 Claims, 14 Drawing Sheets

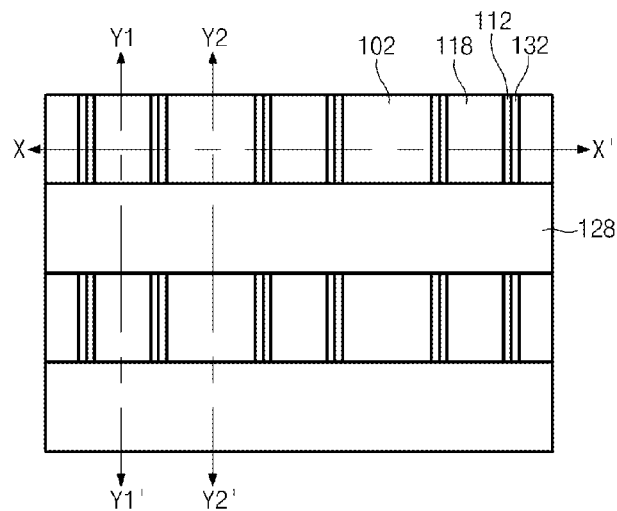
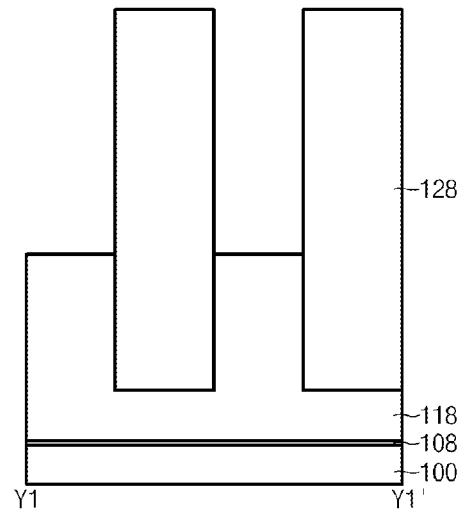
Fig.7A
Fig.7C
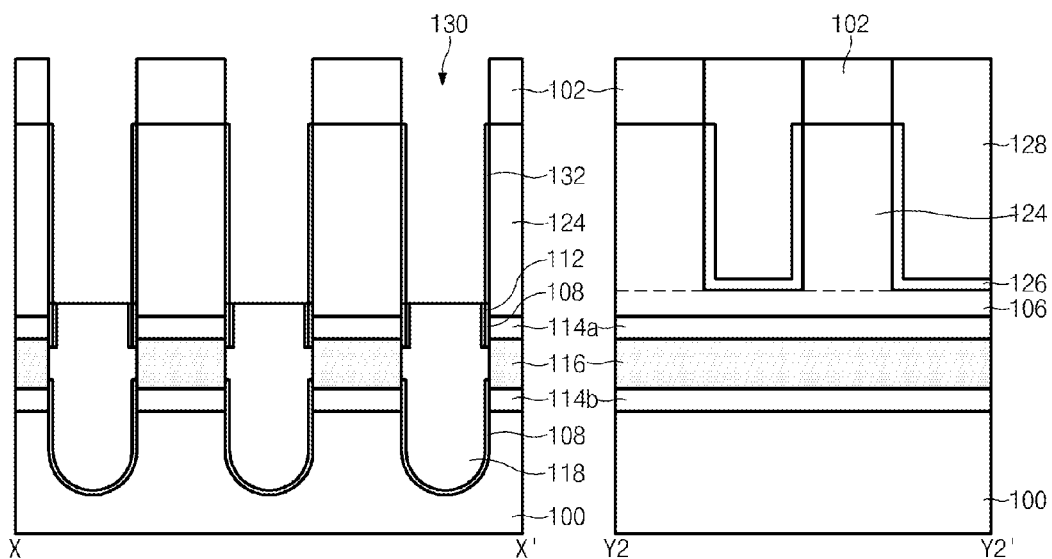
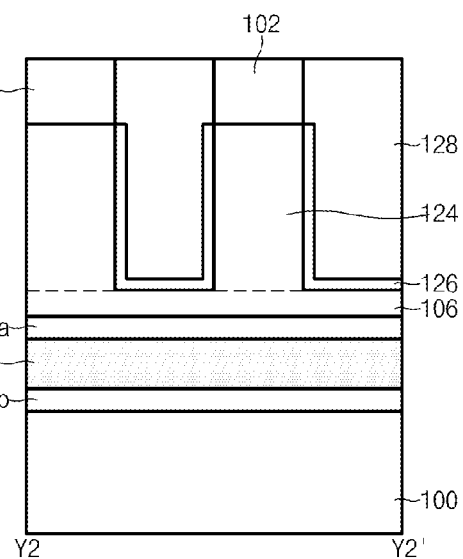
Fig.7B
Fig.7D

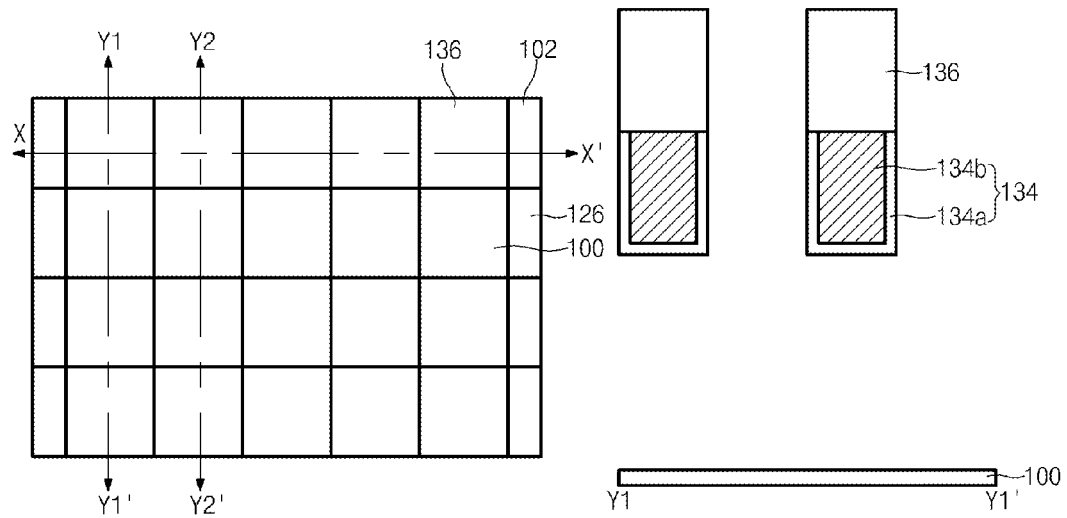
Fig. 10A
Fig. 10C
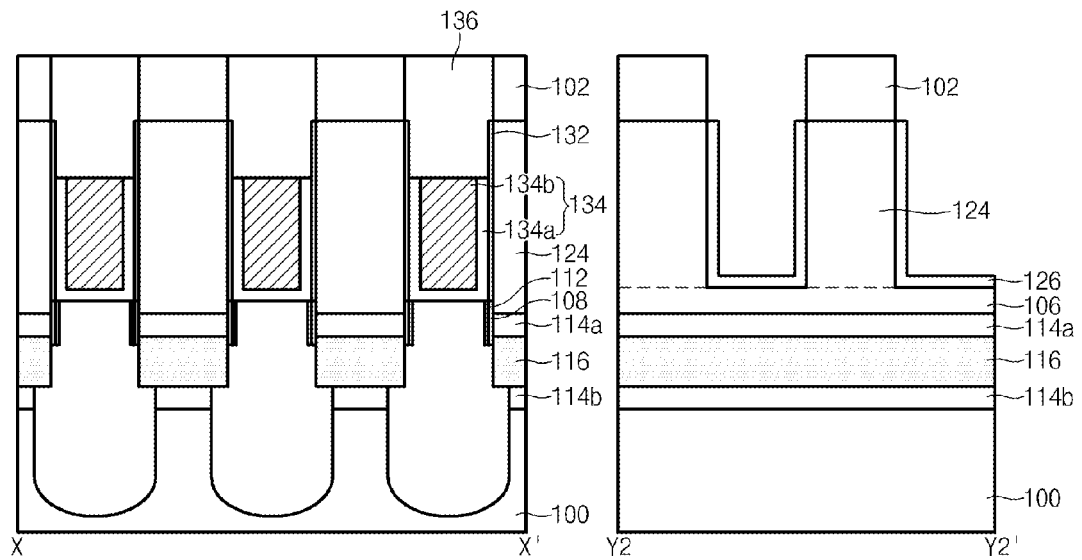
Fig. 10B
Fig. 10D

SEMICONDUCTOR DEVICE HAVING VERTICAL CHANNEL

CROSS-REFERENCE TO RELATED APPLICATION

The priority of Korean patent application No. 10-2013-0062907 filed on 31 May 2013, the disclosure of which is hereby incorporated by reference in its entirety, is claimed.

BACKGROUND

Embodiments relate to a semiconductor device including a vertical channel, and more particularly to a vertical-channel semiconductor device in which some parts of a lower portion of a buried gate are replaced with an insulation film so as to prevent a bit-line junction leakage.

Generally, a semiconductor is a material that falls within an intermediate region between a conductor and a nonconductor in terms of electrical conductivity. Although a semiconductor is similar to a nonconductor in a pure state, electrical conductivity of the semiconductor material can be increased by impurity implantation or other manipulation. The semiconductor is used to form a semiconductor device such as a transistor through impurity implantation and conductor connection. A device including a semiconductor element is referred to as a semiconductor device. A representative example of the semiconductor device is a semiconductor memory device.

A semiconductor memory device may include a plurality of transistors. The transistor may have three regions, i.e., a gate, a source, and a drain. Electric charges are moved between the source and the drain according to a control signal (the magnitude of a voltage) input to the gate of the transistor. The charges between the source and the drain move through a channel region in accordance with the properties and operation of the semiconductor device.

Generally, a method for manufacturing the transistor includes forming a gate over a semiconductor substrate, and forming a source and drain by doping impurities over the semiconductor substrate located at both sides of the gate. A region between the source and the drain may be located below a gate, and is used as a channel region of the transistor. A transistor including a horizontal channel region occupies a relatively large area, so that it may be difficult to form a highly-integrated semiconductor device.

In order to address the above-mentioned issues, there is proposed a vertical-channel semiconductor device in which an active region is formed as a pillar shape, and a source and drain region is located above or below the pillar, so that a vertical-shaped channel region is formed.

However, the higher the degree of integration of the semiconductor device, the shorter a physical distance between gate electrodes or bit lines, such that a bridge may occur between the gate electrodes or the bit lines, or parasitic capacitance between the gate electrodes or the bit lines increases. As a result, there is a need for a new structure capable of being highly integrated while also being easily fabricated.

SUMMARY

Various embodiments are directed to providing a semiconductor device including a vertical channel and a method for forming the same that substantially obviate one or more problems due to limitations and disadvantages of the related art.

An embodiment relates to a technology for improving a structure of the semiconductor device so as to prevent occurrence of a bridge between bit lines, such that coupling capacitance can be reduced and a bit-line junction leakage can be effectively prevented.

In accordance with an aspect of the embodiment, a vertical-channel semiconductor device includes: a first active pillar and second active pillar including a channel region; a first buried bit-line formed below the first active pillar; a second buried bit-line formed below the second active pillar; and an insulation film formed between the first buried bit-line and the second buried bit-line, wherein the insulation film is extended to a lower portion of the first and second buried bit-lines.

The vertical-channel semiconductor device may further include: a first gate pad located at a first side of the first active pillar; a second gate pad located not only at a second side of the first active pillar but also at a first side of the second active pillar; a third gate pad located at a second side of the second active pillar; first to third gate contacts formed over the corresponding gate pad in such a manner the first to third gate contacts are respectively coupled to the first to third gate pads; and a word line formed to cross the first and second buried bit-lines, and coupled to the first to third gate contacts.

In accordance with another aspect of the embodiment, a vertical-channel semiconductor device includes: an active pillar including a channel region; a gate located at a sidewall of the active pillar; a buried bit-line formed below the active pillar; and an insulation film formed below the buried bit-line.

The insulation film may be symmetrically formed below both sides of the buried bit line.

The vertical-channel semiconductor device may further include: a first gate contact formed over the first gate pad so as to be coupled to the first gate pad; a second gate contact formed over the second gate pad so as to be coupled to the second gate pad; and a word line coupled to the first gate contact and the second gate contact.

In accordance with another aspect of the embodiment, a method for forming a vertical-channel semiconductor device includes: forming a silicon line pattern configured to progress along a first direction by etching a substrate; forming a buried bit-line below the silicon line pattern; forming at least one pillar over the buried bit-line by etching the silicon line pattern along a second direction perpendicular to the first direction; forming a gate pad between the pillars along the second direction; etching an insulation material and substrate disposed between the buried bit lines, thereby forming a space extended to a lower portion of the buried bit-line; forming an insulation film in the space; forming a gate contact coupled to the gate pad over the gate pad; and forming a word line coupled to the gate contact over the gate contact.

The forming the buried bit-line includes forming an impurity region below the silicon line pattern; and forming a metal silicide material in the impurity region.

The forming the insulation film includes filling the space with an insulation material in a manner that an air-gap is formed in the insulation material.

It is to be understood that both the foregoing general description and the following detailed description are exemplary and explanatory and are intended to provide further explanation of the invention as claimed.

BRIEF DESCRIPTION OF THE DRAWINGS

FIGS. 6A, 7A, 8A, 9A, 10A, 11A, 12A, 13A and 14A are plan views of a method of manufacturing a semiconductor device according to an embodiment.

FIGS. 6B, 7B, 8B, 9B, 10B, 11B, 12B, 13B and 14B are cross-sectional views taken along line X-X' of FIGS. 6A, 7A, 8A, 9A, 10A, 11A, 12A, 13A and 14A, respectively.

FIGS. 6C, 7C, 8C, 9C, 10C, 11C, 12C, 13C and 14C are cross-sectional views taken along line Y1-Y1' of FIGS. 6A, 7A, 8A, 9A, 10A, 11A, 12A, 13A and 14A, respectively.

FIGS. 6D, 7D, 8D, 9D, 10D, 11D, 12D, 13D and 14D are cross-sectional views taken along line Y2-Y2' of FIGS. 6A, 7A, 8A, 9A, 10A, 11A, 12A, 13A and 14A, respectively.

DESCRIPTION OF EMBODIMENTS

Reference will now be made in detail to the embodiments, examples of which are illustrated in the accompanying drawings. Wherever possible, the same reference numbers will be used throughout the drawings to refer to the same or like parts.

Figure 1A:
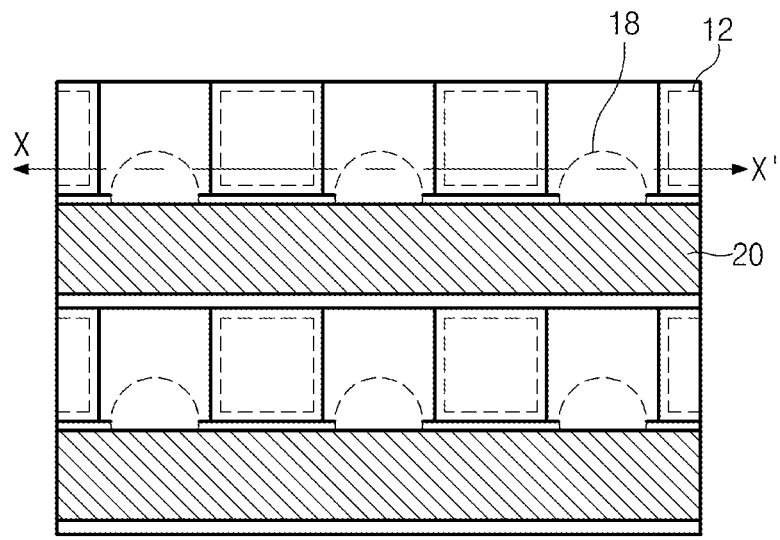
FIG. 1A is a plan view of a semiconductor device according to an embodiment.
Figure 1B:
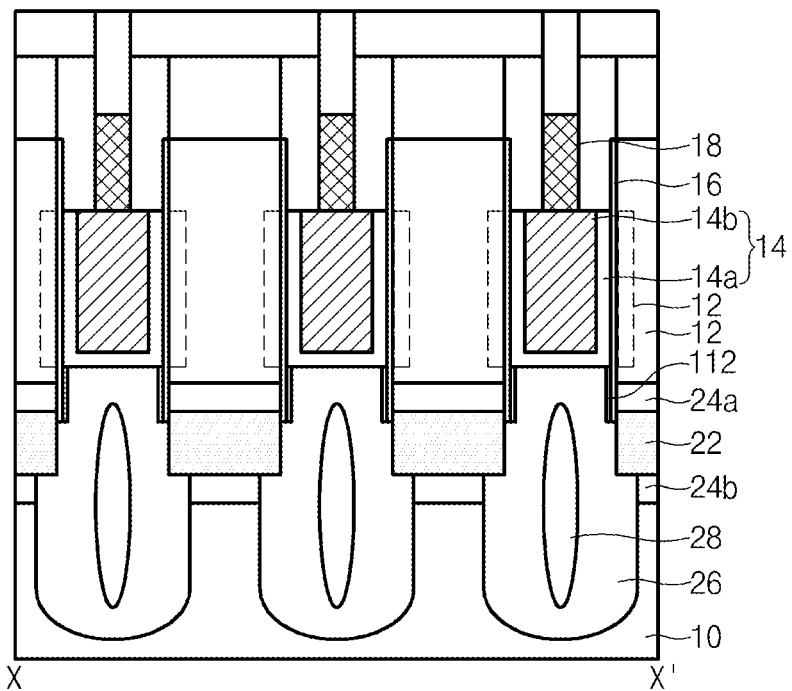
FIG. 1B is a cross-sectional view taken along line X-X' of FIG. 1A.

FIGS. 1A-B are structural views illustrating a semiconductor device according to an embodiment. FIG. 1A is a plan view illustrating the semiconductor device, and FIG. 1B is a cross-sectional view illustrating the semiconductor device taken along the line X-X' of FIG. 1A.

Referring to FIGS. 1A-B, the semiconductor substrate 10 is etched so that active pillars 12 vertically protruded from a semiconductor substrate 10 are arranged at intervals of a predetermined distance, and a gate pad 14 commonly coupled to the corresponding active pillars 12 is formed between the neighboring active pillars 12. The gate pads 14 are arranged in the same direction as the word line 20, and may be formed of a stacked structure of a barrier metal layer 14a (e.g., TiN) and a metal layer 14b (e.g., W). A gate insulation film 16 is formed between the gate pad 14 and the active pillar 12. That is, gates 14 of the embodiment may be formed as a pad shape, and are formed at both sides of the active pillar 12, such that a channel region (12') is formed at both sidewalls of the active pillar 12.

Gate contacts 18 configured to interconnect the gate pad 14 and the word line 20 may be formed over the gate pads 14. In other words, several gate pads 14 arranged along the length direction of the word line 20 may be commonly coupled to the word line 20 through the gate contact 18.

The gate pad 14, the gate contact 18, and the word line 20 may be formed of the same material (for example, metal).

A line-type buried bit-line 22 extending perpendicular to the word line 20 is formed below a channel region of the active pillars 12. The buried bit-line 22 may include metal silicide, preferably, cobalt silicide. Impurity regions (24a, 24b) in which N-type impurities are implanted are formed above or below the buried bit-line 22. The impurity region 24a may serve as a bit-line junction region located between the buried bit-line 22 and the channel region, and may have the same width as the buried bit-line 22. The impurity region 24b may be formed to have a smaller width than the buried bit-line 22.

An air-gap 28 is formed in an insulation film 26 between the buried bit-lines 22, such that coupling capacitance between the neighboring bit-lines 22 is reduced.

In accordance with the embodiment, the insulation film 26 is extended to a lower portion of the buried bit-line 22 so that silicon (or the substrate 10) in the lower portion of the buried bit-line 22 is partially replaced with the insulation film 26, such that a junction leakage of the bit lines 22 can be improved. That is, even though a distance between the buried bit lines 22 and the substrate 10 is reduced to have a smaller width, a current leaked from the neighboring buried bit lines 22 to the substrate 10 is reduced. In order to form the above-mentioned structure, prior to formation of the insulation film 26, not only the impurity region 24 formed below the buried bit-line, but also the substrate 10 may be partially etched, so that the insulation film 26 may also be formed at a lower portion of the buried bit-line 22. As a result, a conductive path between the buried bit-line 22 and the silicon substrate 10 can be blocked, such that a junction leakage of the bit line 22 is prevented.

FIGS. 2A to 14D illustrate a method for forming the semiconductor device shown in FIG. 1. In each of these figures, the figure A is a plan view illustrating the semiconductor device, the figure B is a cross-sectional view illustrating the semiconductor device taken along the line X-X' of the figure A, the figure C is a cross-sectional view illustrating the semiconductor device taken along the line Y1-Y1' of the figure A, and the figure D is a cross-sectional view illustrating the semiconductor device taken along the line Y2-Y2' of the figure A.

Figure 2A:
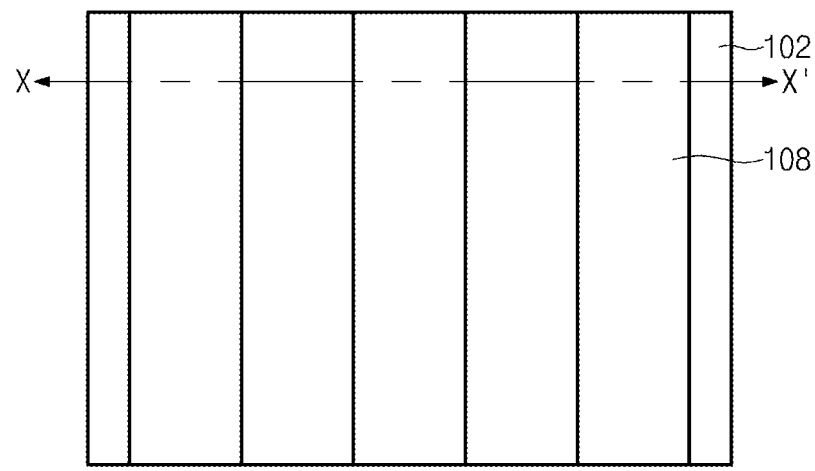
FIGS. 2A, 3A, 4A, and 5A are plan views of a method of manufacturing a semiconductor device according to an embodiment.
Figure 2B:
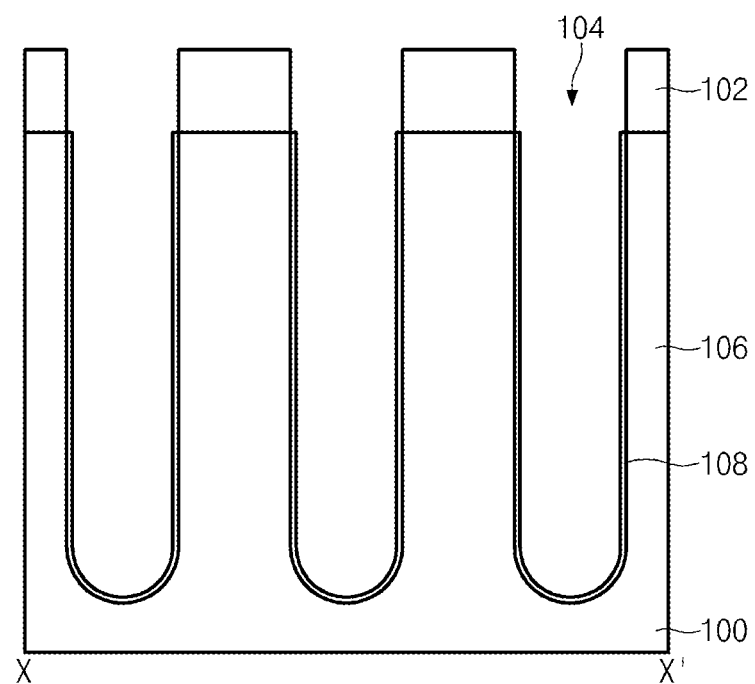
FIGS. 2B, 3B, 4B, and 5B are cross-sectional views taken along line X-X' of FIGS. 2A, 3A, 4A, and 5A, respectively.

Referring to FIGS. 2A and 2B, a hard mask pattern 102 for defining a specific region in which the buried bit-line will be formed is formed over a semiconductor substrate 100. The semiconductor substrate 100 is etched using the hard mask pattern 102 as an etch mask in a manner that a line-type recess 104 is formed, resulting in formation of a silicon line pattern 106 in which the active pillar(s) will be formed in a subsequent process. In this case, the hard mask pattern 102 may be formed of a nitride film.

Subsequently, an insulation film 108 is formed at an inner surface of the recess 104. Here, the insulation film 108 may include a wall oxide film (or an oxide film). The insulation film 108 may be formed through a radical oxidation process on the condition that an oxide film having a predetermined thickness is grown at an inner surface of the recess 104.

Figure 3A:
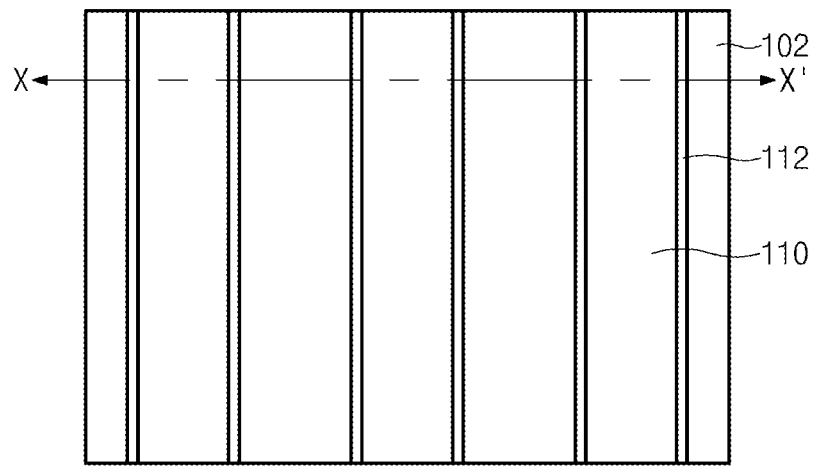
Figure 3B:
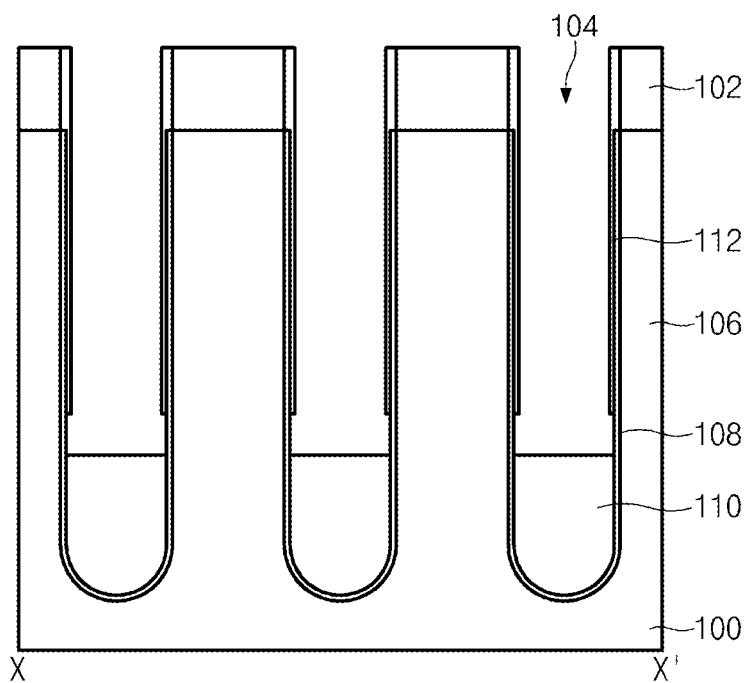

Referring to FIGS. 3A and 3B, a sacrificial film 110 having a predetermined thickness is formed at a lower portion of the recess 14. In this case, the sacrificial film 110 may include polysilicon. For example, after a polysilicon film is formed to fill the recess 104, the polysilicon film is etched back so that the polysilicon film of a predetermined height may remain only at the lower portion of the recess 104.

Subsequently, after a spacer 112 is formed at a sidewall of the recess 104 and over sacrificial film 110, the sacrificial film 110 is additionally etched to a predetermined depth, so that the insulation film 108 is partially exposed. That is, some parts of the insulation film 108 is exposed between the sacrificial film 110 and the spacer 112. Here, the spacer 112 may include a nitride film, and the exposed insulation film 108 may be formed to have a height of about 300 Å.

Figure 4A:
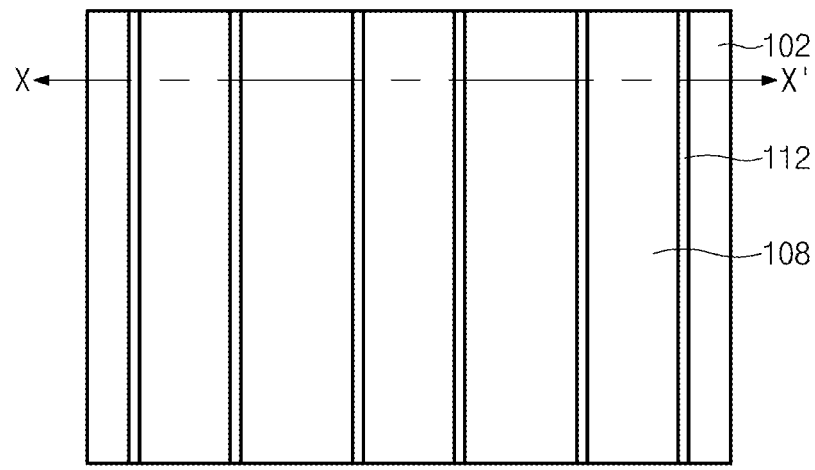
Figure 4B:
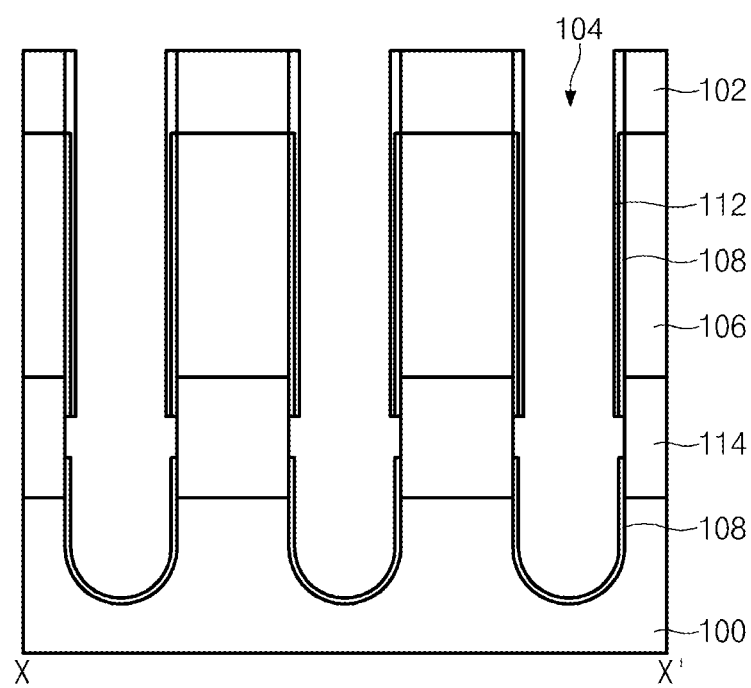

Referring to FIGS. 4A and 4B, the exposed insulation film 108 is selectively removed using an etch selection ratio among the insulation film 108, the sacrificial film 110, and the spacer 112, such that both sidewalls of the silicon line pattern 106 are partially exposed. In this case, the insulation film 108 may be etched through a wet-cleaning process. Subsequently, the sacrificial film 110 remaining at a lower portion of the recess 104 is removed. The sacrificial film 110 may be removed through a strip process.

Thereafter, N-type impurities are implanted in the silicon line pattern 106 exposed at a sidewall of the recess 104, and thermal annealing is then carried out, resulting in formation of an impurity region 114. For example, a Plasma Immersion Ion Implantation (PHI) or Plasma Doping (PLAD) method may be used for implanting such impurities. The thermal annealing may be Rapid Thermal Annealing (RTA).

Figure 5A:
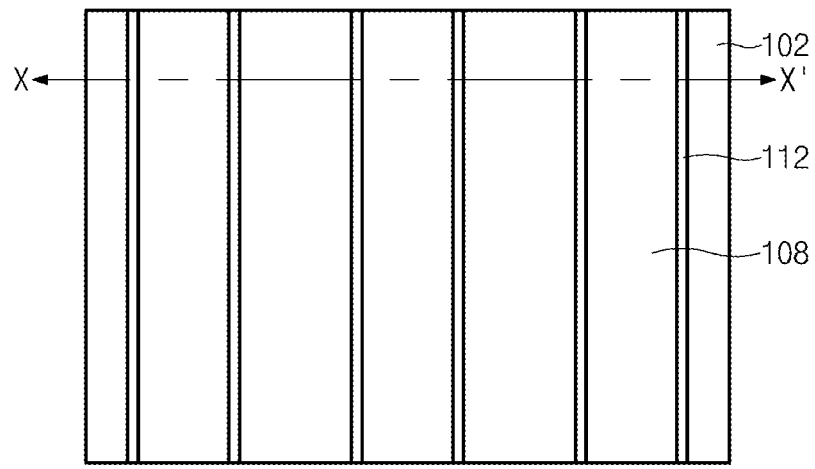
Figure 5B:
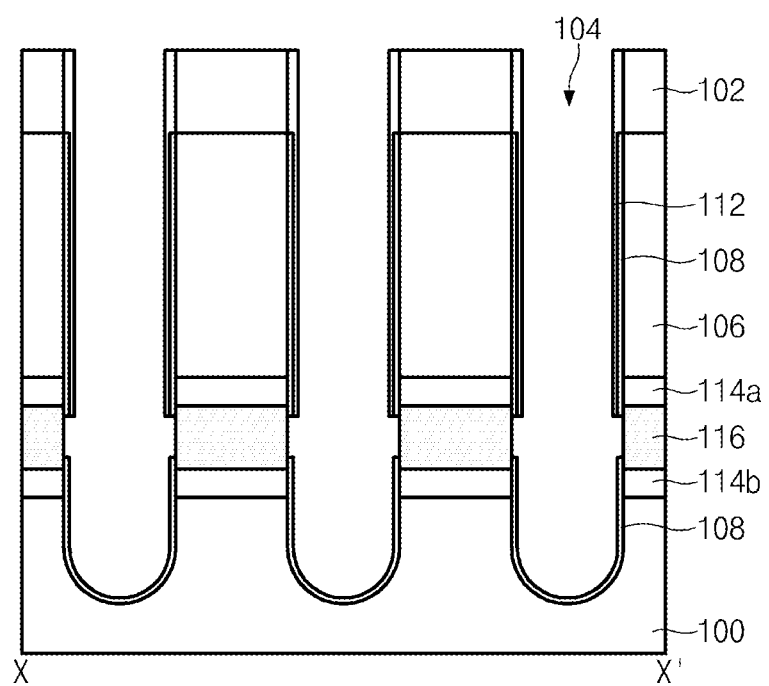

Referring to FIGS. 5A and 5B, a metal material is deposited over a sidewall of the recess 104 so that a metal film (not shown) is formed at a surface of the exposed impurity region 114. Here, the metal material may include cobalt (Co). Subsequently, a thermal annealing process is applied to the metal film (e.g., a cobalt (Co) film) such that a metal silicide (cobalt silicide) film is formed in the impurity region 114. That is, a silicon material of the silicon line pattern 106 reacts with a cobalt material of the cobalt (Co) film through the thermal annealing process, resulting in formation of a cobalt silicide film 116. The cobalt silicide film 116 may be used as a line-type buried bit-line located below the active pillars which will be formed in a subsequent process. Among the entire impurity region 114, an impurity region 114a formed over the cobalt silicide film 116 is used as a bit-line junction region.

Here, the thermal annealing process may be a rapid thermal annealing (RTA) process. In order to obtain a cobalt disilicide ($CoSi_2$) material having lower resistance, the thermal annealing process may be carried out two or more times. For example, a primary RTA process is carried out at a temperature of between about 450° C.~650° C. so that cobalt (Co) of the cobalt (Co) film (not shown) is diffused to the silicon line pattern 106, resulting in formation of cobalt monosilicide (CoSi). Subsequently, the cobalt (Co) film is removed by wet etching, and a secondary RTA process is carried out at a higher temperature of between about 700° C.~900° C. during a shorter period of time as compared to the primary RTA process. As a result, the cobalt monosilicide (CoSi) material may be changed to the cobalt disilicide ($CoSi_2$) material having low resistance and superior thermal stability.

Referring to FIGS. 6A-6D, after an insulation film is filled in the recess 104, the resultant insulation film is planarized, resulting in formation of an interlayer insulation film 118. Here, the interlayer insulation film 118 may include an oxide film (e.g., Spin On Dielectric (SOD) film).

Subsequently, a line-type vertical gate (VG) mask 120 defining a specific region in which active pillars will be formed is formed over the hard mask pattern 102 and the interlayer insulation film 118.

Subsequently, the hard mask pattern 102, the silicon line pattern 106, and the interlayer insulation film 118 are etched using the VG mask 120 as an etch mask so as to form recesses 112, 122' and active pillar(s) 124. In more detail, the silicon line pattern 106 is etched to a predetermined depth at intervals of a predetermined distance, such that a plurality of active pillars 124 may be each formed over the buried bit-line 116.

Figure 6A:
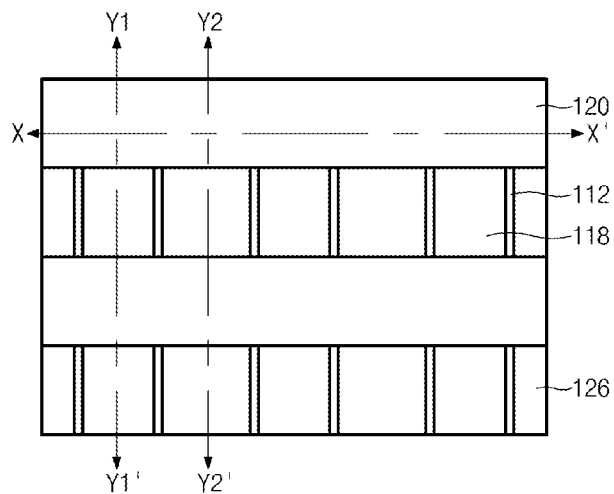
Figure 6C:
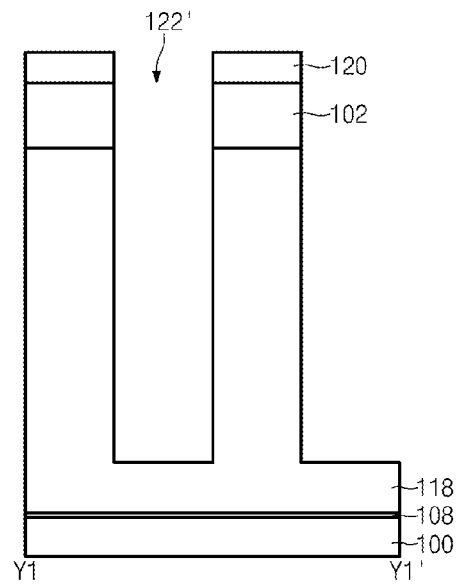
Figure 6B:
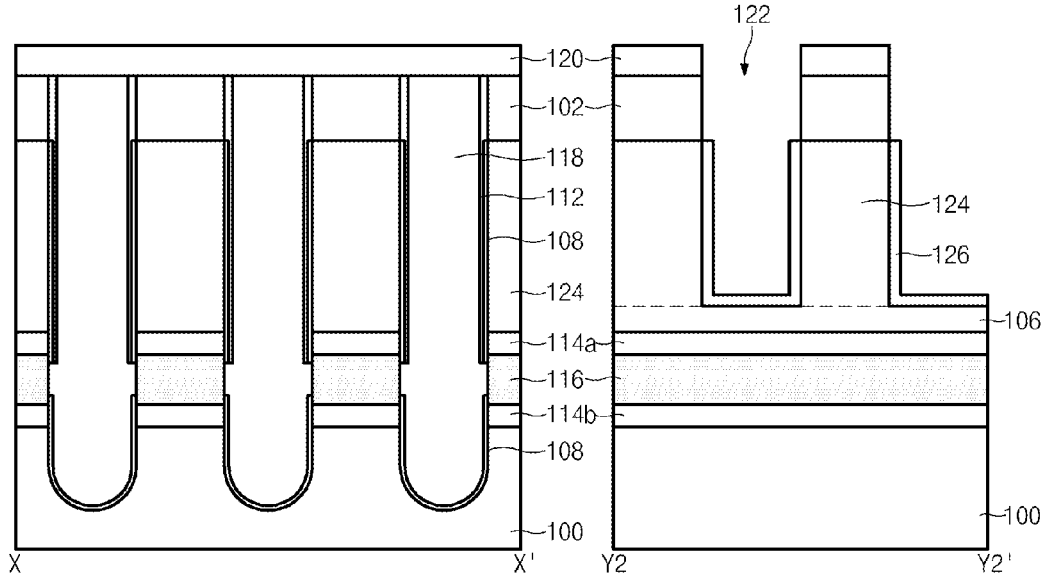
Figure 6D:
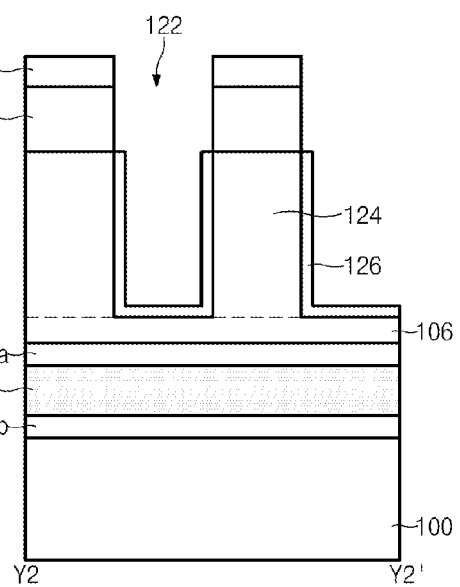
Figure 8A:
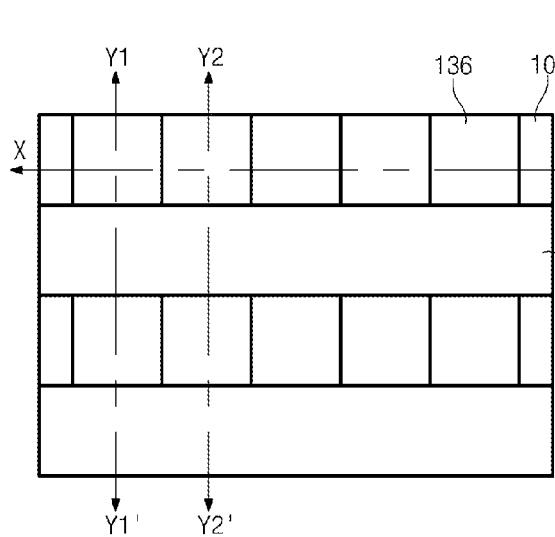
Figure 8C:
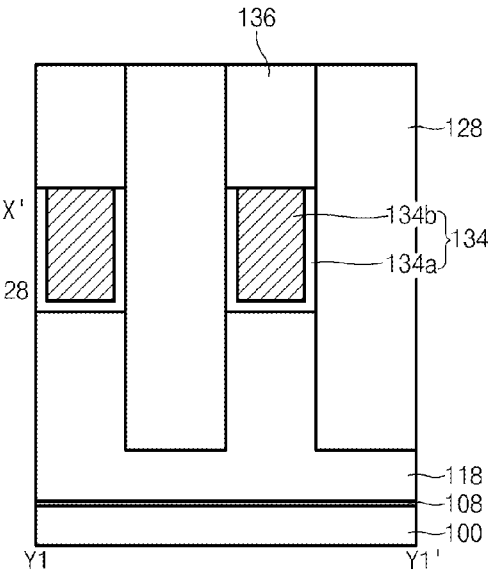
Figure 8B:
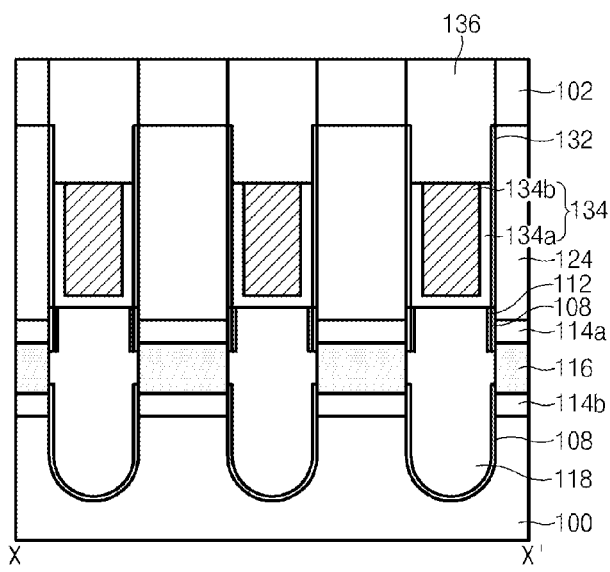
Figure 8D:
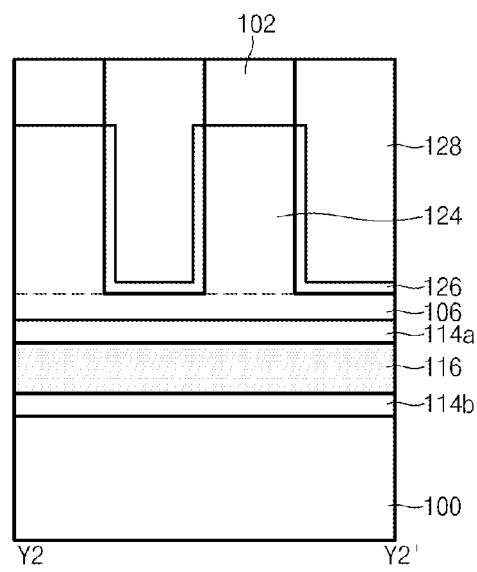
Figures 9A, 9C:
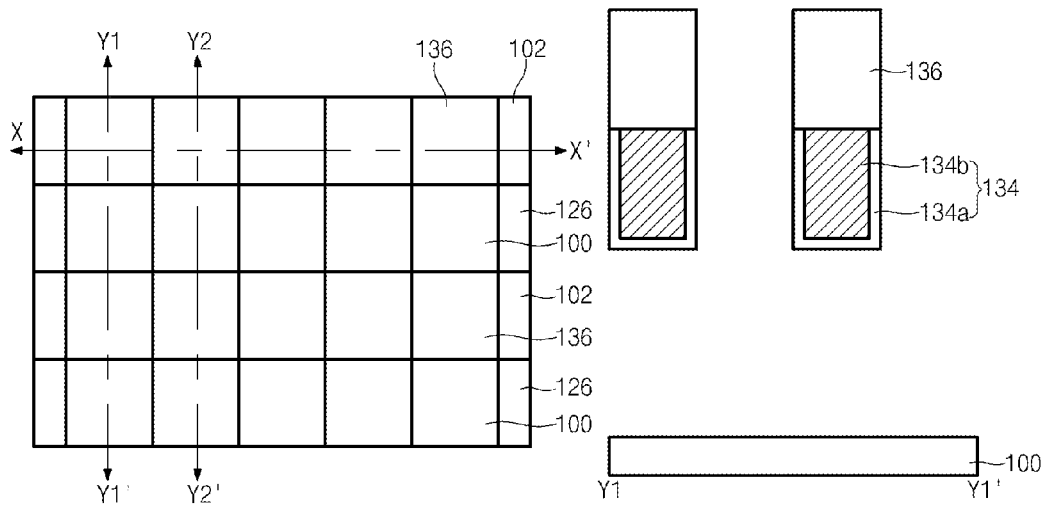
Figures 9B, 9D:
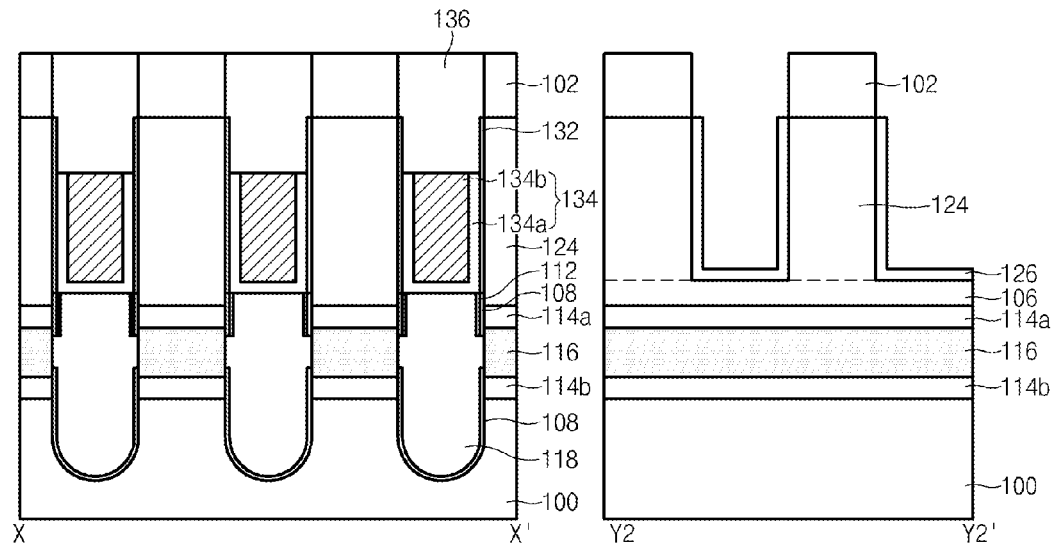
Figures 11A, 11C:
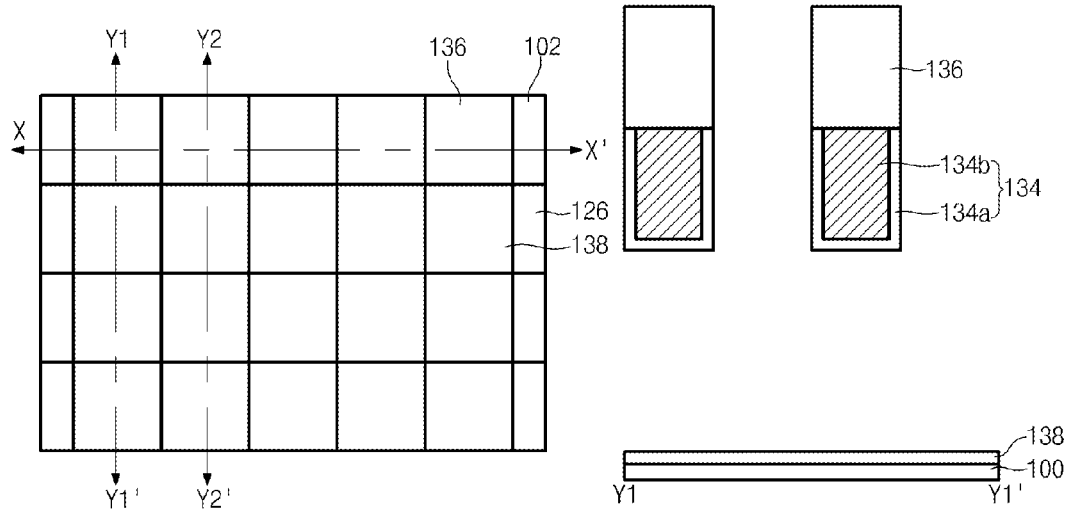
Figures 11B, 11D:
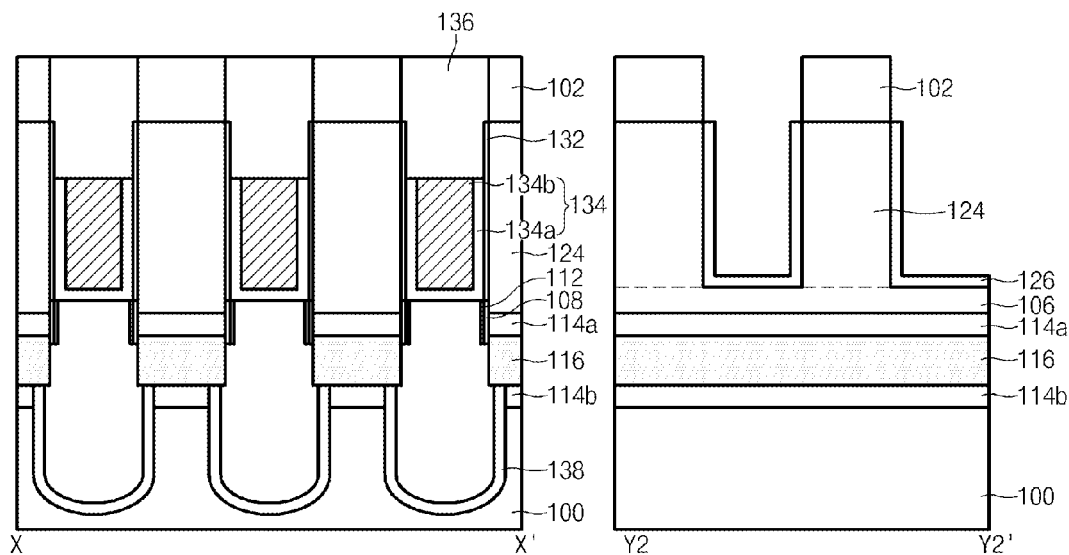
Figure 12A:
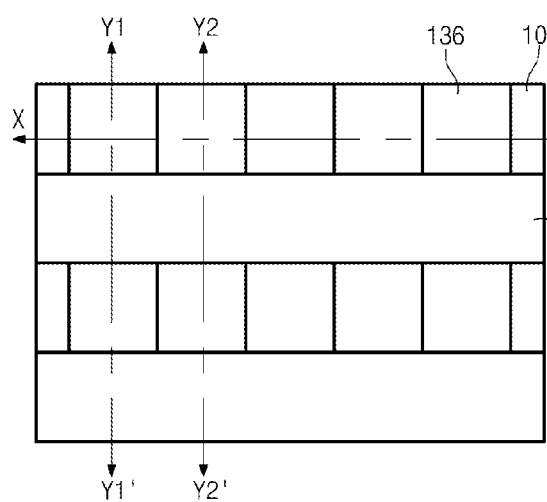
Figure 12C:
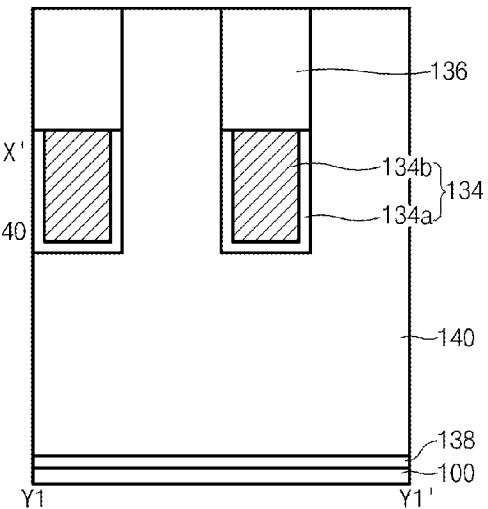
Figure 12B:
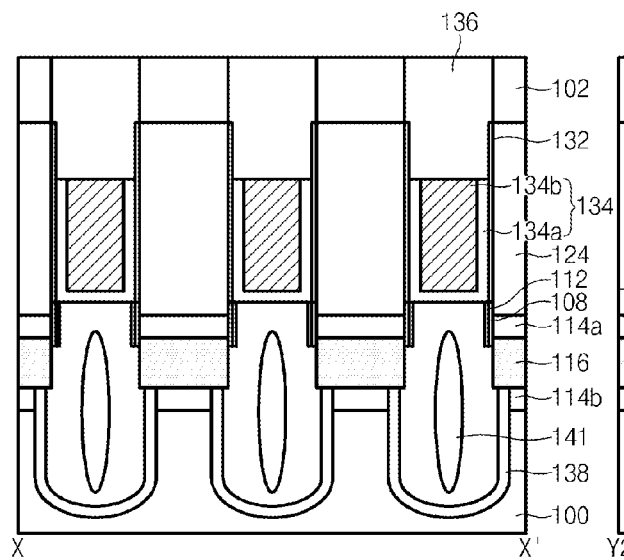
Figure 12D:
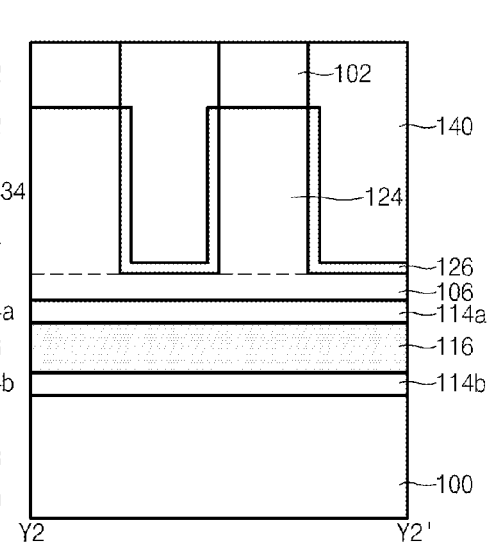
Figure 13A:
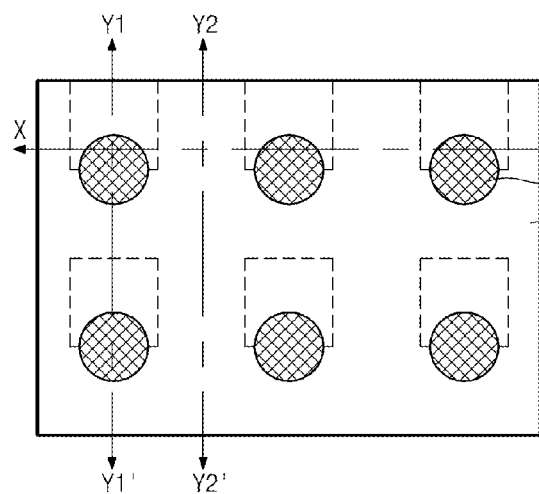
Figure 13C:
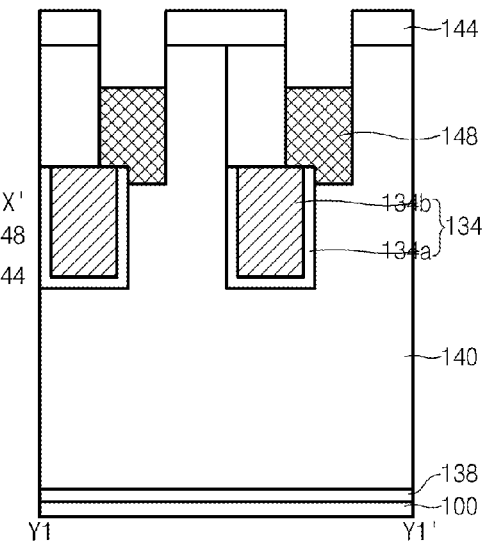
Figure 13B:
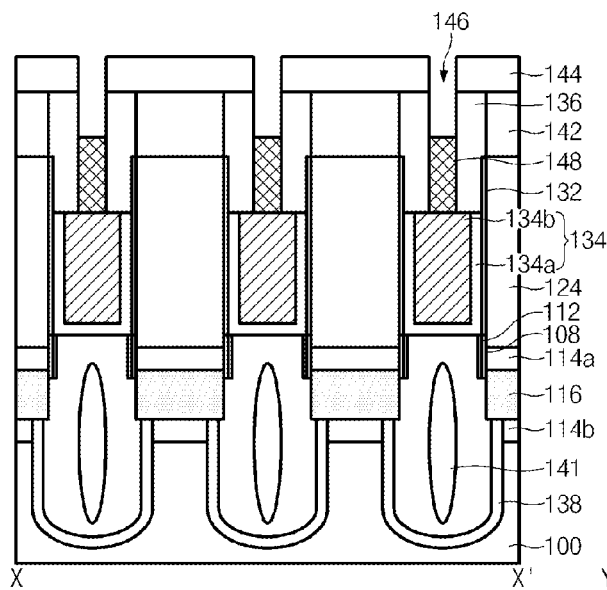
Figure 13D:
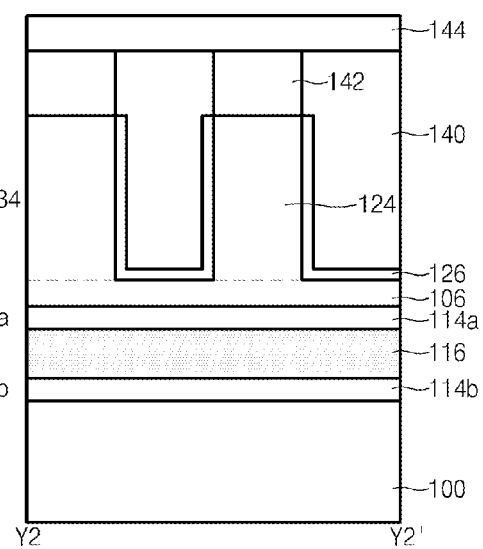
Figure 14A:
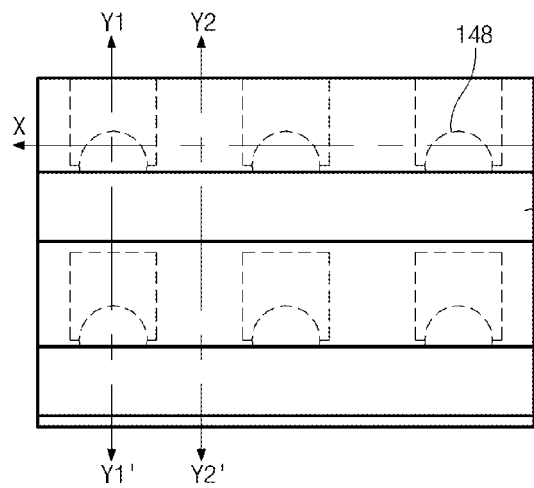
Figure 14C:
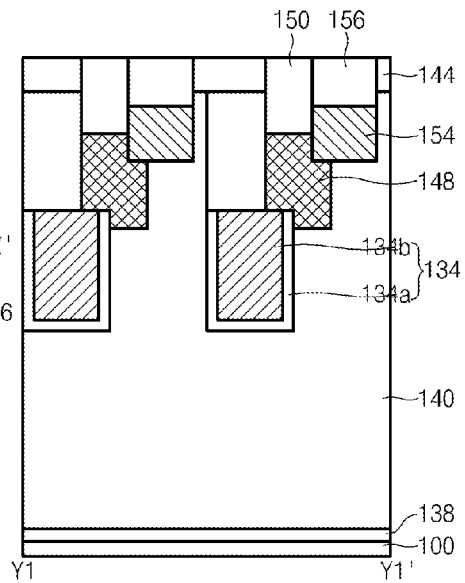
Figure 14B:
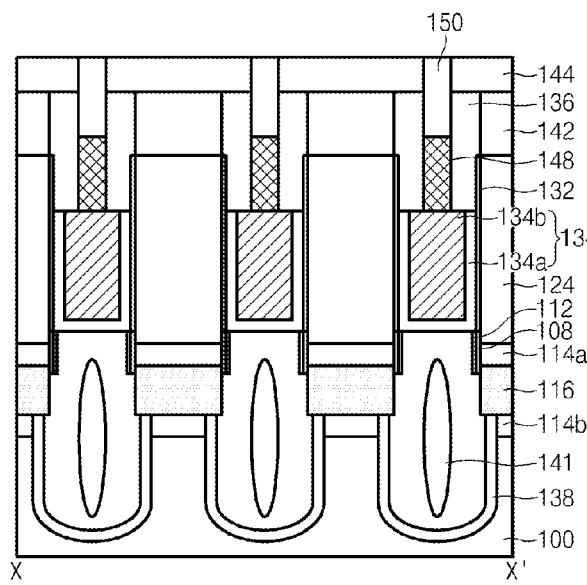
Figure 14D:
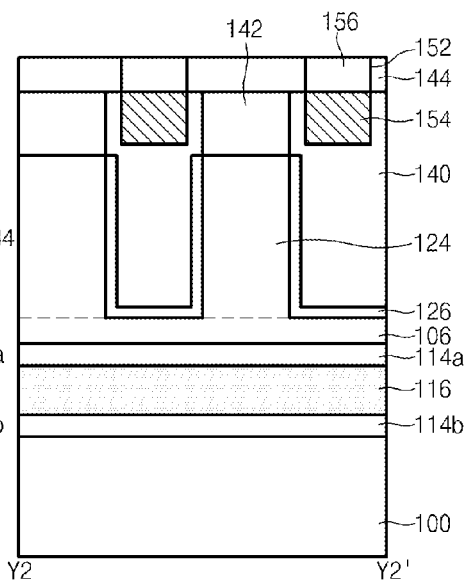

In FIG. 6D, a dotted line may be used to make a distinction between the silicon line pattern 106 and the active pillar 124 for convenience of description and better understanding of the embodiments.

Subsequently, an insulation film 126 is formed over a sidewall of the active pillar 124 exposed by the recess 122 and over a top surface of the silicon line pattern 106. In this case, the insulation film 126 may include an oxide film.

Then, the insulation film 118 between the silicon line patterns 106 is additionally etched from the bottom surface of the recess 122 by a predetermined depth, resulting in formation of a recess 122'. In other words, the insulation film 118 located between the VG masks 120 and between the silicon line patterns 106 is more deeply etched than the active pillar 124.

Referring to FIGS. 7A-7D, silicon (Si) (or SiGe) is formed to fill the recesses (122, 122'), and is then planarized until the hard mask pattern 102 is exposed, resulting in formation of a mold layer 128.

The insulation film 118 exposed between the mold layers 128 is etched to a predetermined depth, resulting in formation of a recess 130. In this case, the spacer 112 and the insulation film 108 that are formed at a sidewall of the active pillar 124 are simultaneously removed.

Subsequently, an oxidation process is carried out so that a gate insulation film 132 is formed at a sidewall of the active pillar 124 from which the insulation film 108 is removed. Here, the gate insulation film 132 may include an oxide film, may be formed through a radical oxidation process, or a high dielectric material having a higher dielectric constant than the silicon oxide film may be deposited over a sidewall of the active pillar 124 through a Chemical Vapor Deposition (CVD) process or the like, such that the gate insulation film 132 may be formed. During the oxidation process, the mold layer 128 is also oxidized, such that a fabrication process needed when the mold layer 128 is removed in a subsequent process may be more facilitated.

Referring to FIGS. 8A-8D, a conductive material is formed to fill the recess 130, and is then etched back, such that a gate pad 134 is formed between the active pillars 124. In this case, the gate pad 134 may be formed of a single metal material (for example, titanium (Ti), titanium nitride (TiN), tungsten (W), tungsten nitride (WN), or the like), or may be formed of a combination thereof. For example, the gate pad 134 may be formed of a stacked structure of a barrier metal (e.g., TiN) film 134a and a tungsten (W) film 134b.

Subsequently, a buffer insulation film 136 is formed over the gate pad 134 so as to fill the recess 130, and is then planarized. The buffer insulation film 136 may include an oxide film. The buffer insulation film 136 may prevent the gate pad 134 from being damaged when the mold layer 128 is removed in a subsequent process. Accordingly, if there is less concern that the gate pad 134 is not damaged when the mold layer 128 is removed, a process for forming the buffer insulation film 136 may be omitted as necessary.

Referring to FIGS. 9A-9D, the mold layer 128 is removed. Here, the mold layer 128 may be removed through the strip process.

Subsequently, not only the insulation film 118 (i.e., the insulation film 118 formed below the mold layer 128) exposed by removal of the mold layer 128, but also the other insulation film 118 formed below the gate pad 134 may be removed. Here, the insulation film 108 is also removed. In more detail, since the insulation film 108 and the other insulation film 118 are removed, the silicon substrate 100 and the impurity region 114b between the silicon line patterns 106 are exposed.

Referring to FIGS. 10A-10D, an impurity region 114b and the silicon substrate 100 that are formed below the buried bit-line 116 may be partially etched in a manner that a space between the buried bit-lines 116 can be extended to a lower portion of the buried bit-line 116. That is, the impurity region 114b and the silicon substrate 100 are partially etched in a manner that a coupling part (or contact area) between the buried bit-line 116 and the substrate 100 has a smaller width than the buried bit-line 116. In this case, the etching process may be a wet-cleaning process or a dry isotropic etching process.

The buffer insulation film 136 may also be removed from the process for removing the insulation film 118 and a silicon removal process.

Referring to FIGS. 11A-11D, an insulation film 138 of a predetermined thickness is formed over the etched impurity region 114b and the etched silicon substrate 100. That is, the insulation film 138, replacing the silicon film, may be formed at a predetermined part of a lower portion of the buried bit line 116. Here, the insulation film 138 may include a wall oxide film (or an oxide film), and may be formed through selective oxidation on the condition that the oxide film of a predetermined thickness is grown at the exposed silicon.

Referring to FIGS. 12A-12D, an insulation film 140 is formed to fill the space between the active pillar 124 and the lower portion of the gate pad 134, and is then planarized to expose the hard mask pattern 102. Here, the insulation film 140 may include an oxide film. In accordance with the embodiment, a silicon material formed below the buried bit-line 116 is replaced with the insulation films (138, 140), such that a junction leakage between the buried bit lines 116 can be improved.

Although the buffer insulation film 136 is shown in FIGS. 12A-12D, all or some parts of the buffer insulation film 136 may be removed from the process for removing the insulation film 118 and the silicon removal process. In this case, the insulation film 140 may also be formed over the gate pad 134.

When the insulation film 140 is filled, since a space between the buried bit-lines 116 is formed to have a deep depth, the space may not be fully filled with the insulation film 140, resulting in formation of an air-gap 141. In accordance with the embodiment, the insulation film 140 is formed in a manner that the air-gap 141 is intentionally formed in the insulation film 140 between the buried bit-lines 116. Accordingly, a Chemical Vapor Deposition (CVD) method for facilitating formation of the air-gap 141 may be used as a method for forming the insulation film 140.

Referring to FIGS. 13A-13D, after the hard mask pattern 102 is removed, a storage node contact (SNC) 142 is formed over the active pillar 124 so as to fill a specific region from which the hard mask pattern 102 is removed. The storage node contact (SNC) 142 may include doped polysilicon.

Thereafter, after an interlayer insulation film 144 is formed over the insulation films (136, 140) and the storage node contact (SNC) 142, a mask (VGC (Vertical Gate Contact) mask) (not shown) configured to define a gate contact region is formed over the interlayer insulation film 144. In this case, a gate contact region may overlap with some parts of the gate pad 134, and some parts of the gate contact region may overlap with a word line to be formed in a subsequent process.

The insulation films (136, 140, 144) are etched using a VGC mask until the gate pad 134 is exposed, resulting in formation of a gate contact hole 146. Subsequently, a conductive material is formed to fill the gate contact hole 146, and is then etched back, resulting in formation of a gate contact 148. Here, a conductive material for forming the gate contact 148 may include a metal material, and may be formed of the same material as the gate pad 134.

Referring to FIGS. 14A-D, an insulation film 150 is formed over the gate contact 148 so as to fill the gate contact hole 146, and is then planarized. Here, the insulation film 150 may include an oxide film.

Subsequently, after a line-type mask (WL mask) (not shown) defining a word-line region is formed over the interlayer insulation films (144, 150), the insulation films (140, 144, 150) are etched using the WL mask as an etch mask until the gate contact 148 is exposed, resulting in formation of a recess 152. Thereafter, a spacer (not shown) is formed at a sidewall of the recess 152.

After a conductive material (not shown) is formed to fill the recess 152, the conductive material is planarized until the insulation film 144 is exposed. Here, the conductive material may be formed of the same material as a gate pad 134 or a gate contact 148.

Subsequently, the conductive material is etched back such that a word line 154 buried in a lower portion of the recess 152 is formed. After an insulation material is formed to fill the recess 152, the insulation material is planarized, resulting in formation of the insulation film 156. Here, the insulation film 156 may include an oxide film.

A method for forming a contact hole exposing a storage node contact (SNC) 142 and forming a capacitor (not shown) coupled to the storage node contact (SNC) 142, and a subsequent process thereof may be identical to or similar as those of a conventional fabrication process for forming a vertical-channel semiconductor device, and as such a detailed description thereof will herein be omitted for convenience of description and better understanding.

For example, according to embodiments, in FIGS. 1A-B, the gate 14 shaped as a pad type is formed between the active pillars 12, and the gate 14 is coupled to the word line 20 through the gate contact 18. However, the gate may be formed as a surrounding gate structure configured to enclose the active pillar and extend in the same direction as the word line.

As is apparent from the above description, the semiconductor device and the method for forming the same according to the embodiments can prevent occurrence of a leakage between neighboring bit-lines, resulting in reduction of coupling capacitance.

In addition, the semiconductor device and the method for forming the same according to the embodiments can prevent a bit-line junction leakage.

The above embodiments are illustrative and not limitative. Various alternatives and modifications are possible. The embodiments are not limited by the type of deposition, etching polishing, and patterning steps described herein. Nor are the embodiments limited to any specific type of semiconductor devices. For example, the embodiment may be implemented in a dynamic random access memory (DRAM) device or non volatile memory device.

What is claimed is:
1. A vertical-channel semiconductor device comprising:
   first and second active pillars each including a channel region;
   a first buried bit-line disposed below the first active pillar;
   a first upper impurity region disposed between the channel region and the first buried bit-line;
   a first lower impurity region disposed below the first buried bit-line and having a smaller width than the first upper impurity region;
   a second buried bit-line disposed below the second active pillar;
   a second upper impurity region disposed between the channel region and the second buried bit-line;
   a second lower impurity region disposed below the second buried bit-line and having a smaller width than the second upper impurity region; and
   an insulation film disposed between the first buried bit-line and the second buried bit-line,
   wherein the insulation film extends below the first buried bit-line, extends below the second buried bit-line, or extends below both the first buried bit-line and the second buried bit-line, and
   wherein the first lower impurity region is vertically aligned with a center portion of the first buried bit-line and the second lower impurity region is vertically aligned with a center portion of the second buried bit-line.

2. The vertical-channel semiconductor device according to claim 1, further comprising:
   a first gate pad located at a first side of the first active pillar;
   a second gate pad located at a second side of the first active pillar and at a first side of the second active pillar;

a third gate pad located at a second side of the second active pillar;

first to third gate contacts disposed over the corresponding gate pads and respectively coupled to the first to third gate pads; and a word line extending across the first and second buried bit-lines, and coupled to the first to third gate contacts.

3. The vertical-channel semiconductor device according to claim 2, wherein the first to third gate pads are arranged in a same direction as the word line.

4. The vertical-channel semiconductor device according to claim 2, wherein the first to third gate pads include a stacked structure of a barrier metal film and a tungsten film.

5. The vertical-channel semiconductor device according to claim 2, wherein the first active pillar is disposed between the first gate contact and the second gate contact, and the second active pillar is disposed between the second gate contact and the third gate contact.

6. The vertical-channel semiconductor device according to claim 1, wherein the first and second buried bit-lines include a cobalt silicide ($CoSi_2$) material.

7. The vertical-channel semiconductor device according to claim 1, further comprising an air-gap formed in the insulation film.

8. A vertical-channel semiconductor device comprising:
    an active pillar including a channel region;
    a gate located at a first sidewall of the active pillar;
    a buried bit-line disposed below the active pillar;
    a first impurity region disposed between the channel region and the buried bit-line;
    a second impurity region disposed below the buried bit-line and having a smaller width than the first impurity region; and
    an insulation film extending below the gate to below the buried bit-line,
    wherein the second impurity region is vertically aligned with a center portion of the buried bit line.

9. The vertical-channel semiconductor device according to claim 8, wherein the insulation film extends symmetrically with respect to the gate below the buried bit line and a neighboring buried bit-line.

10. The vertical-channel semiconductor device according to claim 8, wherein the gate includes:
    a first gate pad disposed at a second sidewall of the active pillar; and
    a second gate pad disposed at a third sidewall of the active pillar in such a manner that the second gate pad is isolated from the first gate pad.

11. The vertical-channel semiconductor device according to claim 10, further comprising:
    a first gate contact disposed over the first gate pad and coupled to the first gate pad;
    a second gate contact disposed over the second gate pad and coupled to the second gate pad; and
    a word line coupled to the first gate contact and the second gate contact.

12. The vertical-channel semiconductor device according to claim 11, wherein the active pillar is disposed between the first gate contact and the second gate contact.

13. The vertical-channel semiconductor device according to claim 8, wherein the buried bit-line includes a cobalt silicide ($CoSi_2$) material.

14. The vertical-channel semiconductor device according to claim 8, further comprising:
    an air-gap disposed at both sides of the buried bit-line.

* * * * *